United States Patent [19]

Rustenburg

[11] 4,267,512

[45] May 12, 1981

[54] DIGITAL FREQUENCY DIVIDER

[76] Inventor: William C. Rustenburg, 12 Washington Ave., Burlington, Mass. 01803

[21] Appl. No.: 5,112

[22] Filed: Jan. 22, 1979

[51] Int. Cl.³ .................. H03K 21/36; H03K 21/06
[52] U.S. Cl. ...................................... 328/48; 328/46
[58] Field of Search ....................... 328/46, 48, 41; 307/225 R

[56] References Cited

U.S. PATENT DOCUMENTS

| | | | |
|---|---|---|---|
| 3,341,693 | 9/1967 | Hurst | 328/46 X |
| 3,395,352 | 7/1968 | McCammon | 328/46 |
| 3,725,791 | 4/1973 | Moreau et al. | 328/41 |
| 3,967,205 | 6/1976 | Rossi et al. | 328/46 |
| 3,992,635 | 11/1976 | Suzuki et al. | 328/48 X |
| 4,092,604 | 5/1978 | Berney | 328/48 |

*Primary Examiner*—John S. Heyman
*Attorney, Agent, or Firm*—Donald J. Singer; Willard Matthews, Jr.

[57] ABSTRACT

An input signal having a frequency is supplied as input to an exclusive 'OR'-gate, the signal is sent to a register selected for the number of times the input signal is to be divided, output from the register is sent to an 'AND' gate, output from this gate is fed back to the 'OR' gate which, after the selected count, inverts the signal to the register resetting the register. Output of the register is an odd function of the input signal.

1 Claim, 2 Drawing Figures

DIGITAL FREQUENCY DIVIDER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to electronic circuits and more particularly to digital frequency divider circuitry.

The techniques of frequency division have long been known and practiced in the electronics art. The most common form of division practiced is the even division as opposed to the division of frequency by odd numbers. For even division, relatively simple systems have been developed. However, where odd division is required, indirect methods with sophisticated systems are needed to perform the task. Frequency division is utilized for synchronized frequency hopping in secure voice communications using a fixed frequency input. It is also used for satellite navigation where multiple, related frequencies must be used to determine radio frequency bending in the ionosphere. Additionally, frequency division may be used in a system for a variable-tuned two-way instantaneous communication channel. Another use would be for generating in-phase sub-carriers, such as television sound and picture, or for multi-channel communication networks such as stereo sound systems.

Currently, there are no frequency dividers of the nature of the invention which are simple, low in cost and which would allow their use in commercially available retail electronics systems.

SUMMARY OF THE INVENTION

The invention provides a digital means for obtaining frequency division. In one form it will provide a third sub-harmonic when any random frequency is applied but yet remain quiescent when no input signal is present. This circuit requires no adjustment or critical components and may be readily expanded to other odd divisors, for example seven and fifteen.

In its fundamental form, the circuit creates an output pulse for every three input pulses. The output is synchronous with the input. No random or spurious pulses are generated and no output is generated without an input signal.

The generation of an extra pulse with the third input pulse allows the use of available binary equipment which adds dependability to the system. A particularly advantageous aspect of the invention derived from the digital design is the lack of a need of adjustment or the need for frequency compensation networks regardless of wide variations in frequency input.

The invention provides for the generation of a third or other odd sub-harmonic or any random frequency. The generated frequency will automatically be in step with the input regardless of drift or any deliberate change in input frequency.

It is therefore an object of the invention to provide a new and improved digital frequency divider.

It is another object of the invention to provide a new and improved digital frequency divider that is low in cost, easily maintained and simple in operation.

It is a further object of the invention to provide a new and improved digital frequency divider that has an output always synchronous with the input.

It is still another object of the invention to provide a new and improved digital frequency divider that is quiescent when there is no input.

It is still a further object of the invention to provide a new and improved digital frequency divider that utilizes digital equipment and requires no adjustment or frequency compensation networks.

It is another object of the invention to provide a digital frequency divider which is economical to produce and utilizes conventional, currently available components that lend themselves to standard mass production manufacturing techniques.

These and other advantages, features and objects of the invention will become more apparent from the following description taken in connection with the illustrative embodiment in the accompanying drawing.

DESCRIPTION OF THE PREFERRED EMBODIMENT

Figure 1:
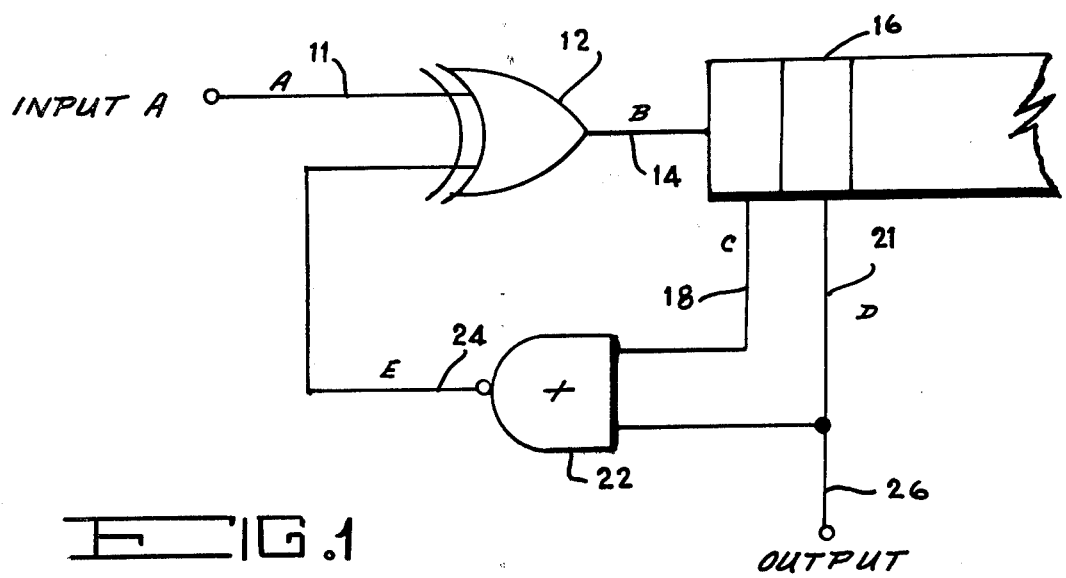
FIG. 1 is a circuit drawing of the invention.

Referring now to FIG. 1, an input signal of any selected or random frequency enters the circuit via line 1 and procedes to EXOR gate 12. The signal passes along line 14 to register 16. Output from the register will pass via lines 18 and 21 to NAND gate 22. The output from the NAND gate is fed back into the EXOR gate 12 thereby inverting the next input pulse creating an extra pulse causing register 16 to reset and begin counting again.

Figure 2:
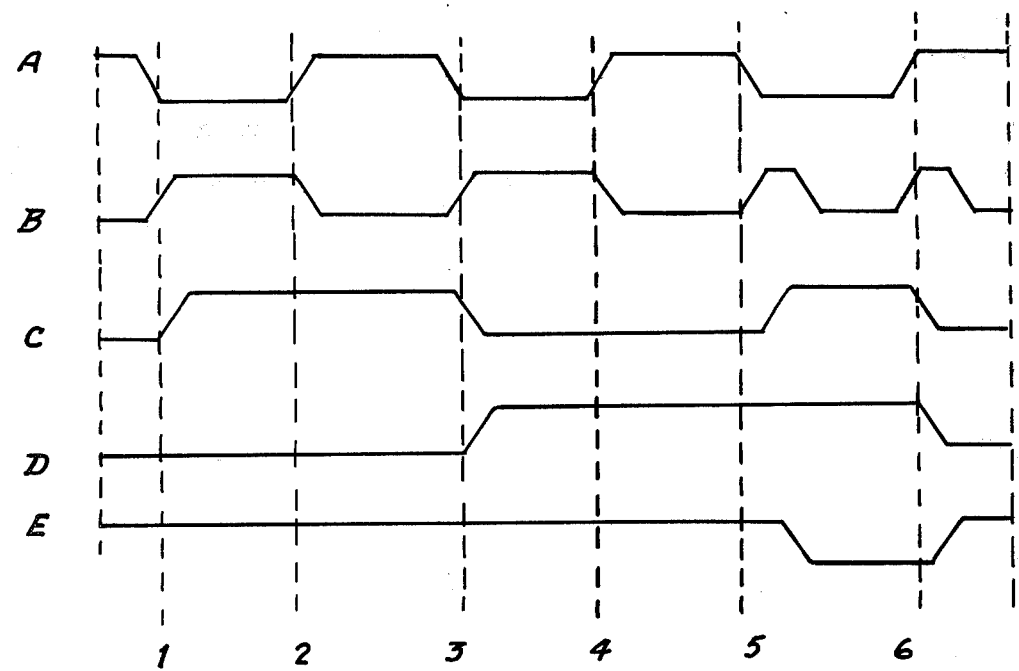
FIG. 2 is a graphic representation of the signals in the circuit of the invention.

FIG. 2 shows a graphic representation of the signal as it passes through the circuit. The signals are moving between a binary 0 and 1 condition. The circuit registers condition changes in the input signal and is not concerned with the duration or condition of the signal other than changes in condition.

Initially, input signal A is 1, signal B, C and D are 0 and E is 1. During the first step (10) as A goes to 0, the output of the EXOR gate, B, goes to 1; thereby clocking a count into register 16. The register content is now 01. In the second step (20), as A goes to 1, B goes to 0. This is the end of the input pulse to the register and does not alter the content of the register. The third step (30) is the same as the first step (10) but the register now contains two counts 10. Step 40 is like step 20, the end of the second input pulse. Step five (50) is the same as step (10) with the third input pulse. The register now contains three count i.e. 11. With both C and D positive the output of NAND gate (22), E, changes conditions. The change of E causes B to change states, thereby terminating the input pulse to register 16.

In step six (60), as A goes to 1; B, contrary to steps (two and four) (20) (40), also goes to 1 because of the changed state of E. Thus, B becomes another input pulse to the register. The register advances another count to 00. As the change in E will cause B to change, effectively terminating the register's input and the circuit is returned to its initial condition.

Output 26 of the circuit now consists of a single pulse, as opposed to the three pulses for the input signal A.

Although the invention has been described with reference to a particular preferred embodiment, numerous modifications or alterations may be made therein without departing from the spirit and scope of the invention as set forth in the appended claims.

What is claimed is:

1. A circuit for dividing an electronic signal having a frequency by an odd number and producing an output that is synchronous with the input comprising: an EXOR gate having first and second inputs and an output, means for applying an input signal to the first input of said EXOR gate; a two stage register means the first stage thereof connected to receive the output of the EXOR gate; a NAND gate having first and second inputs and an output; means connecting the first stage output of the register to the first input of the NAND gate; means connecting the second stage output of the register to the second input of the NAND gate; means connecting the output of the NAND gate to the second input of the EXOR gate, and means for taking output from the register which has a frequency less than said input signal to the EXOR gate.

* * * * *